United States Patent [19]

Behfar-Rad

[11] Patent Number: 5,075,743
[45] Date of Patent: Dec. 24, 1991

[54] QUANTUM WELL OPTICAL DEVICE ON SILICON

[75] Inventor: Abbas Behfar-Rad, Ithaca, N.Y.

[73] Assignee: Cornell Research Foundation, Inc., Ithaca, N.Y.

[21] Appl. No.: 362,252

[22] Filed: Jun. 6, 1989

[51] Int. Cl.$^5$ .................................... H01L 33/00
[52] U.S. Cl. ........................... 357/17; 357/4; 357/16; 372/43; 372/45
[58] Field of Search ............... 357/16, 17, 4; 372/43, 372/45

[56] References Cited

U.S. PATENT DOCUMENTS

| | | | |
|---|---|---|---|
| 3,760,240 | 9/1973 | Bergt | 317/235 R |
| 3,963,538 | 6/1976 | Broadie et al. | 357/17 |
| 4,365,260 | 12/1982 | Holonyak | 357/16 |
| 4,378,259 | 3/1983 | Hasegawa et al. | 357/16 |
| 4,386,429 | 5/1983 | Anthony | 357/16 |
| 4,503,540 | 3/1985 | Nakashima et al. | 357/17 |
| 4,512,022 | 4/1985 | Tsang | 357/17 |
| 4,563,764 | 1/1986 | Kuroda et al. | 357/17 |
| 4,596,998 | 6/1986 | Krimel | 357/17 |
| 4,616,241 | 10/1986 | Biefeld et al. | 357/16 |
| 4,644,553 | 2/1987 | Ruyven et al. | 357/17 |
| 4,675,709 | 6/1987 | Scifres et al. | 357/17 |
| 4,684,964 | 8/1987 | Dankove et al. | 357/17 |
| 4,706,254 | 11/1987 | Nojiri et al. | 357/17 |
| 4,750,183 | 6/1988 | Takahashi et al. | 372/45 |
| 4,841,533 | 6/1989 | Hayakawa et al. | 372/45 |
| 4,862,470 | 8/1989 | Suyama et al. | 372/45 |

FOREIGN PATENT DOCUMENTS

| | | | |
|---|---|---|---|
| 0225680 | 12/1983 | Japan | 372/45 |
| 0213068 | 10/1985 | Japan | 357/17 |
| 0087381 | 5/1986 | Japan | 357/17 |
| 0194891 | 8/1986 | Japan | 372/45 |
| 63-155781 | 6/1988 | Japan | 357/17 |
| 0182876 | 7/1988 | Japan | 357/17 |

OTHER PUBLICATIONS

Hashimoto et al., "AlGaAs . . . Vapor Deposition", Appl. Phys. Lett. 48 (23), Sept. 6, 1986.
Razeghi et al., "High Quality . . . Silicon Substrate", Appl. Phys. Lett. 52 (3), Jan. 18, 1988.
Yokoyama et al., High Quality Zinc Sulfide Epitaxial Layers Grown on (100) Silicon by Molecular Beam Epitaxy, Appl. Phys. Lett., Aug., 1986.
Mori et al., New Hydride Vapor Phase Epitaxy for Gap Growth on Si, Appl. Phys. Lett., Oct., 1987.
Yates et al., Structural and Compositional Integrity of Lattice-Matched $ZnSe_{0.95} S_{8.05}$ on (100) Oriented GaAs, Appl. Phys. Lett., Sept., 1987.
Sakai et al., MOCVD Growth of III-V Compounds on Si Using Strained Super Lattices, Mati Res. Soc., 1986.
Blum et al., Integrated Multicolor Light-Emitting Diode Array, IBM T.D.B., vol. 15, No. 2, Jul., 1972.

*Primary Examiner*—Rolf Hille
*Assistant Examiner*—MinhLoan Tran
*Attorney, Agent, or Firm*—Jones, Tullar & Cooper

[57] ABSTRACT

A semiconductor structure for use in forming optical devices, such as lasers and LEDs, is disclosed. The structure includes a silicon base on which is formed by epitaxial growth, a crystalline material (such as AlGaP) structure or region that is nearly lattice matched to silicon. One or more quantum wells are formed in the crystalline material structure. A quantum well can be made of a direct bandgap material or an indirect bandgap material with isoelectronic centers (IECs). The regions on either side of the quantum wells can be graded to form a graded index separate confinement heterostructure (GRINSCH). To reduce problems of warpage, the crystalline material can be epitaxially grown in windows formed in a layer of silicon nitride or silicon dioxide on the silicon substrate. A multi-color array of optical devices can be provided with this structure.

14 Claims, 5 Drawing Sheets

QUANTUM WELL OPTICAL DEVICE ON SILICON

BACKGROUND OF THE INVENTION

The present invention relates, in general, to semiconductor structures for use in optical devices which include a silicon substrate having a near lattice matched semiconductor crystal deposited thereon containing a direct bandgap quantum well or an indirect bandgap quantum well with an isoelectronic impurity to form an isoelectronic center (IEC).

Recently, there has been tremendous interest in monolithically integrating optical devices with silicon devices. As silicon is an indirect bandgap material, it cannot be used as an efficient light source, until such time when a suitable IEC is incorporated into silicon allowing a reasonably efficient infrared light source. It is direct bandgap materials which can be used to manufacture very efficient lasers and light emitting diodes (LEDs). With the incorporation of IECs in some indirect bandgap materials, reasonably efficient LEDs have been fabricated. Recent improvements in epitaxial growth techniques have allowed the heteroepitaxy of semiconductor crystals such as GaAs, InP, GaP, ZnS, and others on silicon. GaAs and InP have a lattice mismatch of approximately 4% and 8%, respectively, with silicon. GaP and ZnS, however, have lattice mismatches with silicon which are very small (less than 0.4%), and can be referred to as near lattice matched crystals on silicon. Use of these near lattice matched crystals on silicon prevents formation of large numbers of misfit dislocations.

SUMMARY OF THE INVENTION

The present invention provides a semiconductor structure for use in optical devices which includes a silicon base or substrate and a near lattice matched semiconductor crystal such as $Al_xGa_{1-x}P$. The $Al_xGa_{1-x}P$ is used to form a graded index separate confinement heterostructure (GRINSCH) with a quantum well. This structure can be employed to form lasers or LEDs. The quantum well is formed by sandwiching a thin film of a semiconductor crystal between two higher bandgap materials.

The preferred thickness for unstrained quantum wells, such as nitrogen doped GaP for the $Al_xGa_{1-x}P$ system, is between 50 and 500 Angstroms. For strained quantum wells, such as a GaAs quantum well for the $Al_xGa_{1-x}P$ system, the thickness has to be lower than a critical thickness above which dislocation defects arise. The nitrogen doped GaP quantum well is an example of an indirect bandgap quantum well with IECs. The GaAs quantum well, on the other hand, is an example of a direct bandgap quantum well.

The single quantum well can be replaced by a plurality of quantum wells if desired. A quantum well in a multiple quantum well structure has to be separated from an adjacent quantum well by means of a barrier made of a semiconductor crystal of a higher bandgap than the quantum well.

The semiconductor material from which the quantum well is constructed of and the well's thickness determine the wavelength of the light emitting device it creates. For the $Al_xGa_{1-x}P$ system with appropriate quantum wells, light-emitting devices can be fabricated to give wavelengths from that of infrared through green. This by itself can be used to form mono- or multi-color flat panel high-resolution displays on a silicon substrate. Using blue-emitting ZnS diodes with the above, red, green, and blue primary colors would be available, allowing complete high-resolution flat panel displays on silicon.

BRIEF DESCRIPTION OF THE DRAWINGS

The objects, features and advantages of the present invention will become apparent from a consideration of the following detailed description of preferred embodiments thereof, taken in conjunction with accompanying drawings, in which.

DETAILED DESCRIPTION OF THE PREFERRED EMBODIMENT

Figure 1A:
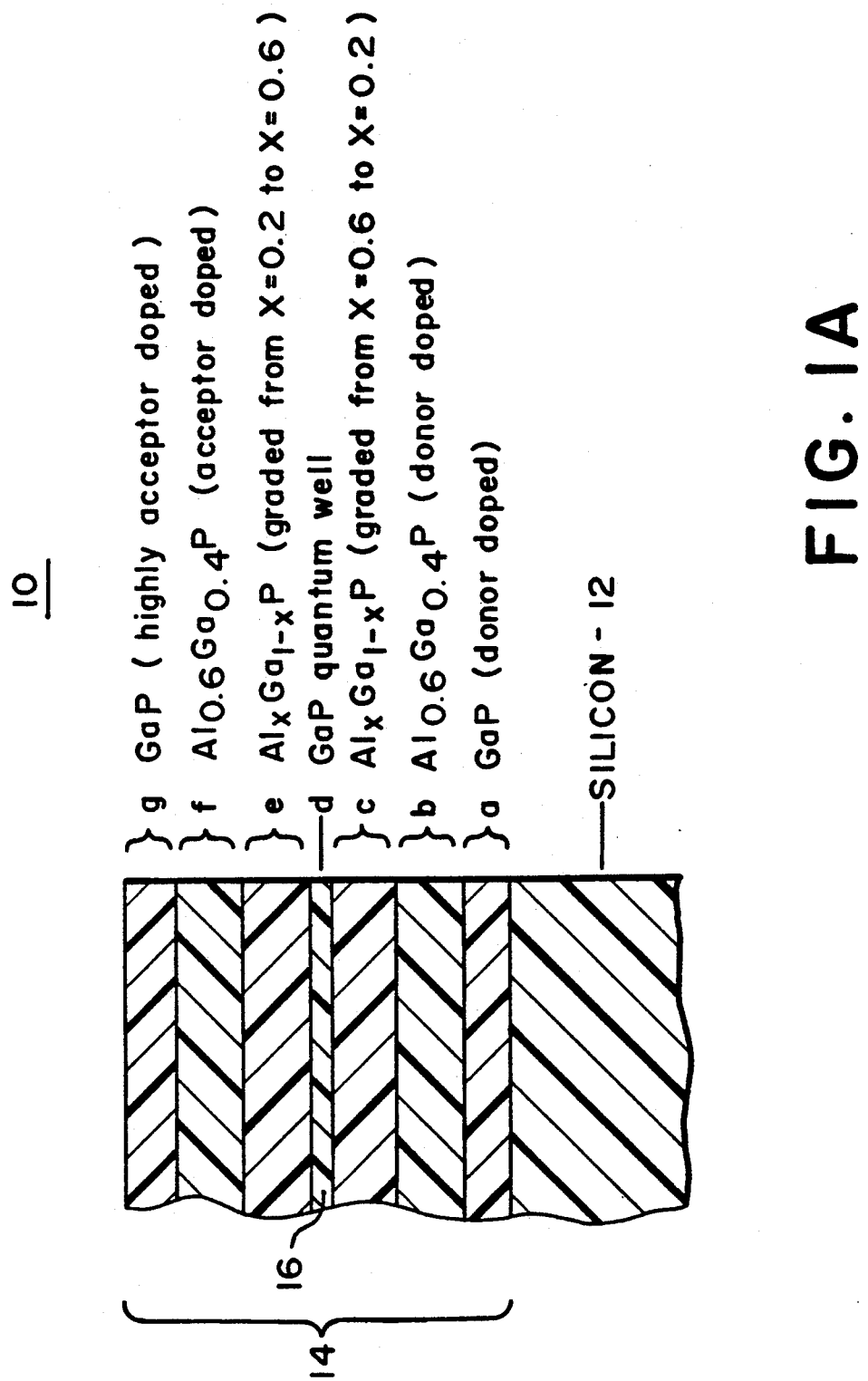
FIGS. 1A and 1B are cross sectional side views of layered semiconductor structures constructed in accordance with two embodiments of the present invention.

Turning now to a more detailed consideration of the present invention, there is illustrated in FIG. 1A, a layered semiconductor structure 10 which includes a silicon substrate 12, on which is epitaxially grown, a multiple layer crystalline structure 14. Structure 14 includes a quantum well layer 16 which is formed therein during the epitaxial growth process, as discussed in further detail below.

Crystalline structure 14 is composed of a material that is nearly lattice matched with silicon substrate 12. Examples of such materials include $Al_xGa_{1-x}P$ (where $0 \leq x \leq 1$) and ZnS. The quantum well layer 16 is a thin portion of crystalline structure 14. The quantum well 16 is made of a semiconductor crystal with a bandgap lower than its adjacent semiconductor crystals. This leads to a one dimensional finite potential well which spatially localizes holes and electrons and forms quantized hole and electron states so that the chances of radiative recombination, and release of photons, are thereby enhanced. This leads to optimization of the luminescence efficiency of the light-emitting quantum well 16.

The quantum well 16 is either a direct bandgap material or an indirect bandgap material with IECs. It must be noted that some bulk semiconductors which are direct bandgap, may become indirect bandgaps when used in the form of a quantum well. The preferred thickness of the quantum well 16 is from 50 to 500 Angstroms. In the case where the quantum well 16 is formed from a material that is lattice mismatched, the quantum well layer thickness is chosen to be less than the critical thickness above which dislocations form. This will allow the mismatch to be accommodated by uniform lattice strain.

Crystalline structure 14 is a GRINSCH single quantum well (SQW) structure containing the following layers as illustrated in FIG. 1A:

(a) GaP buffer region (donor doped);
(b) $Al_{0.6}Ga_{0.4}P$ cladding region (donor doped);

(c) $Al_xGa_{1-x}P$ linearly graded region from x=0.6 to x=0.2 (undoped);

(d) GaP quantum well (nitrogen doped to form IEC);

(e) $Al_xGa_{1-x}P$ linearly graded region from x=0.2 to x=0.6 (undoped);

(f) $Al_{0.6}Ga_{0.4}P$ cladding region (acceptor doped); and, (g) GaP cap region (highly acceptor doped).

Figure 2A:
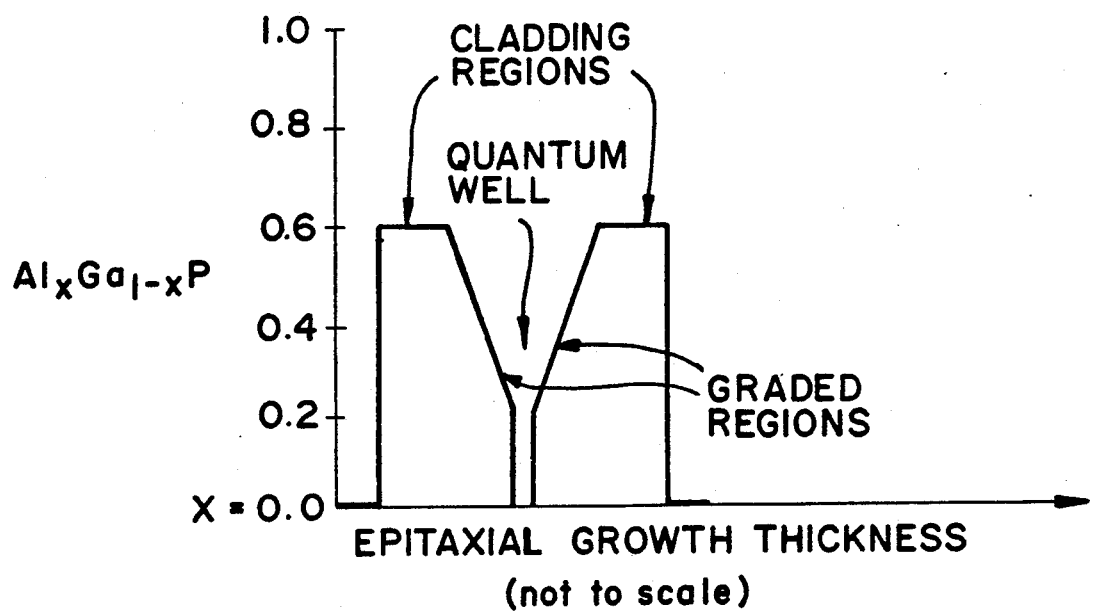
FIGS. 2A-C are graphical illustrations of three different embodiments of the invention showing the formation of quantum wells in a layer of epitaxially grown semiconductor crystalline material.

FIG. 2A illustrates the composition of crystalline structure 14 in terms of x in $Al_xGa_{1-x}P$ as a function of epitaxial growth thickness. The following variations can be made to structure 14:

(i) The doping of (a) and (b) can be changed to be acceptor doped while (f) and (g) are changed to donor doped.

Figure 2B:
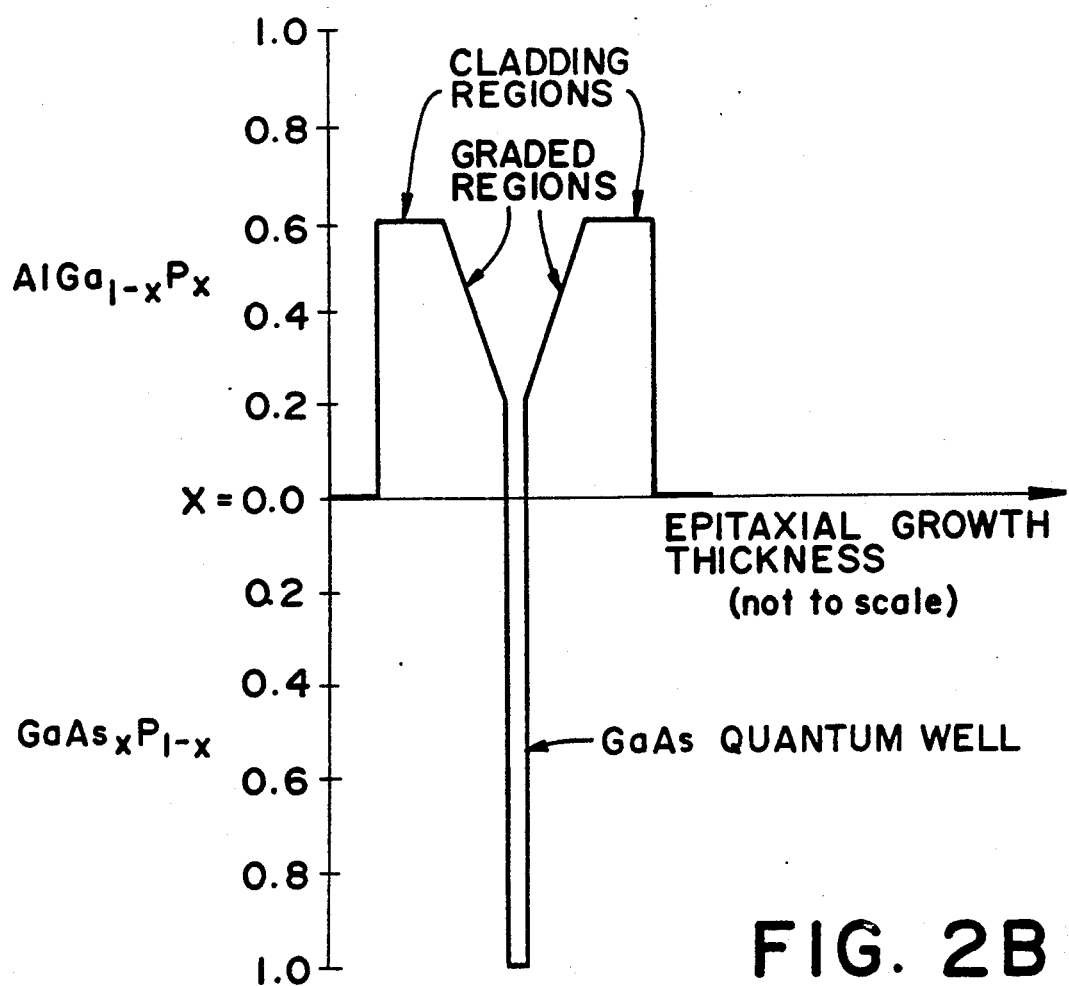

(ii) The nitrogen-doped GaP quantum well in (d) can be replaced by a lattice mismatched undoped quantum well from the binary, ternary, or quaternary semiconductor compounds formed from the following elements: Ga,As,In,P, and Al, so long as the quantum well remains direct bandgap and the lattice mismatch is accommodated by uniform lattice strain. This, of course, will impose limitations on the composition and thickness of the quantum well. An example of such a variation is shown in FIG. 2B for a GaAs quantum well. In this example, the thickness of the GaAs quantum well should be chosen to be less than the critical thickness above which dislocations form. Although the critical thickness varies depending on the material, for GaAs on AlGaP, it is about 100 Angstroms.

(iii) The single quantum well (d) can be replaced by two or more quantum wells separated by thin barriers, the barriers themselves being formed from a higher bandgap material than the quantum well.

(iv) For a quantum well of smaller bandgap than GaP, the graded regions (c) and (d) could be replaced by linearly graded regions from x=0.6 to x=0 and x=o to x=0.6, respectively, to improve optical confinement and slightly change quantum well characteristics. However, a small reduction in carrier confinement will be experienced.

(v) The percentage of Al in GaAlP in (b) and (f) can be increased to give better optical confinement for a laser. This will affect the initial and final compositions in (c) and (e), respectively.

The thickness of layers (b) and (f) are important if the device is to be a laser, as they act as the claddings in the laser waveguide. Their thicknesses should be between 0.3 μm and 1.5 μm. However, for LEDs their thicknesses can be reduced. Regions (c) and (e) are useful in providing a "funnel" effect which guide carriers into the quantum well. This effect is useful in both lasers and LEDs. These regions also significantly contribute to the waveguide action for a laser device. The thickness of each of these graded regions is about 0.2 μm.

LEDs and lasers formed using the above layers would have to be contacted via metallizations. The LEDs and lasers operate when a sufficient electrical potential is applied across their layers via the metallizations. Furthermore, it is necessary to have optical feedback for lasers. This can be achieved by means of facets which are formed by cleaving or etching the semiconductor crystal. Gratings formed on the semiconductor crystal can also be used to provide optical feedback.

Figure 1B:
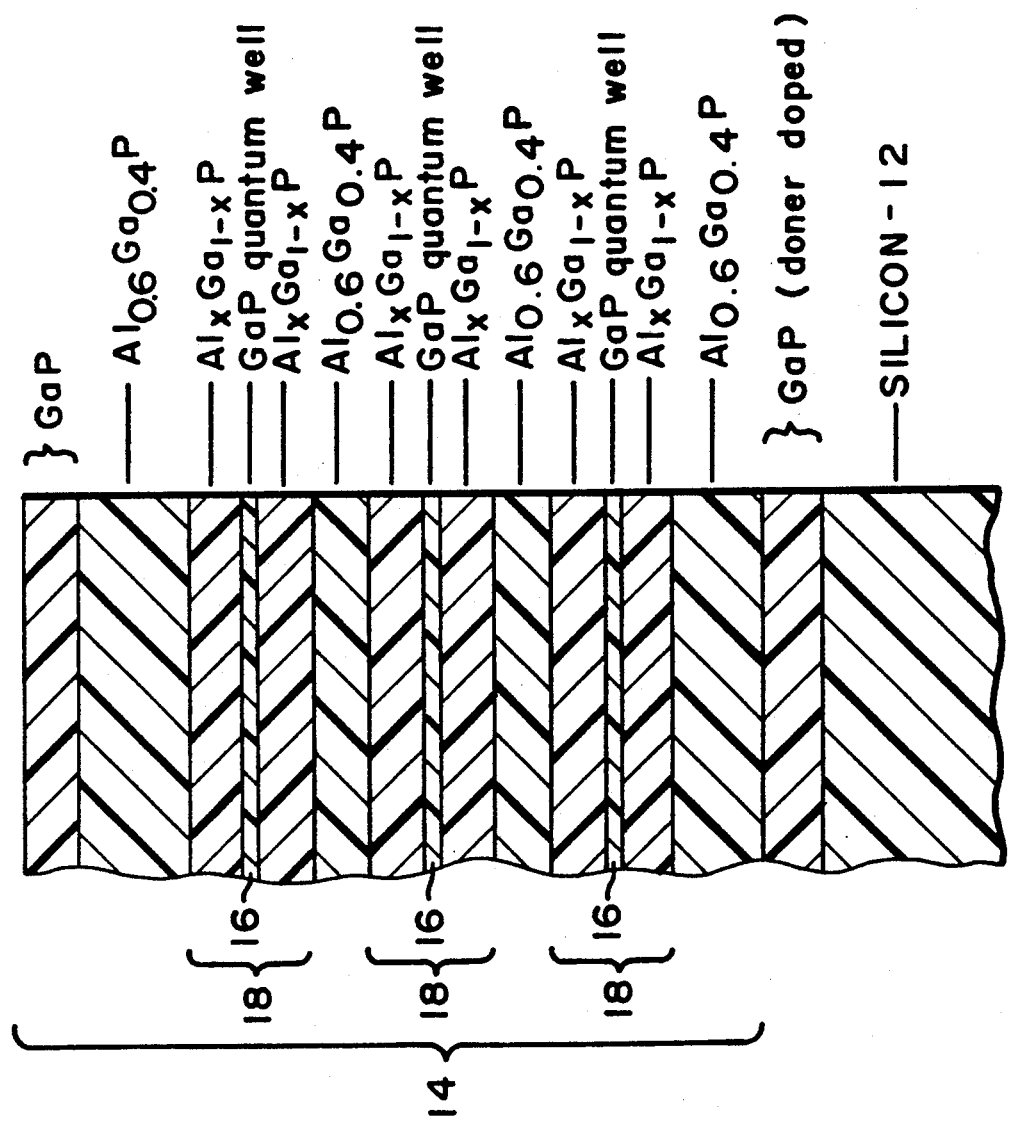
Figure 2C:
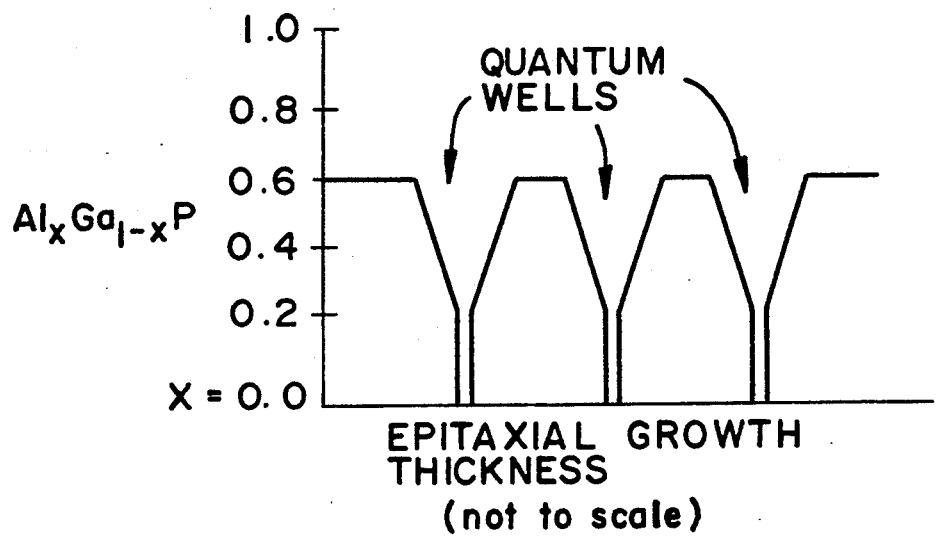

Turning now to FIGS. 1B and 2C, there are illustrated yet another configuration of crystalline structure 14 in which a plurality of GRINSCH structures 18 are formed in one epitaxial growth. In particular, crystalline structure 14 is formed in the same manner as in FIGS. 1A and 2A, but includes three quantum wells 16 as illustrated in FIG. 1B and graphically depicted in FIG. 2C. By varying the thickness and composition of individual quantum wells in each GRINSCH, various wavelengths of emitted light from each of them can be obtained provided they are excited individually and separately from one another by application of electrical potential. This can be used to form multi-color high-resolution displays on silicon.

Figure 3:
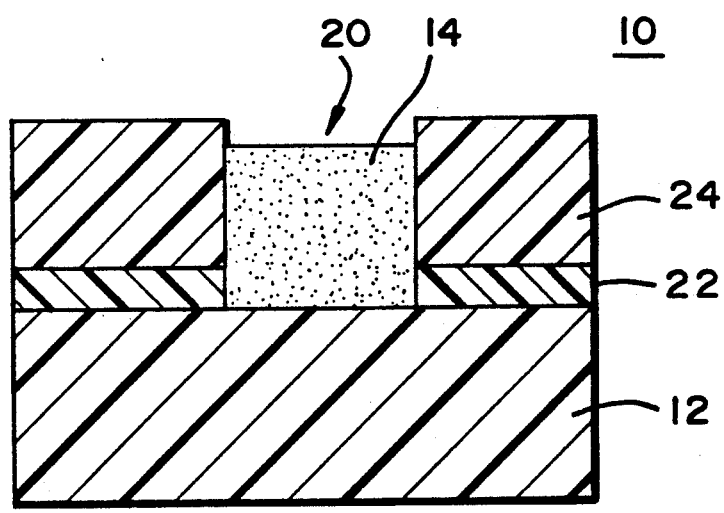
FIG. 3 is a cross sectional side view of a layered semiconductor structure constructed in accordance with another embodiment of the invention; and, FIG. 4 is a perspective view of an array of light emitting devices constructed in accordance with the present invention.

In FIG. 3, there is illustrated a modification to the FIGS. 1B and 2C in which crystalline structure 14 is deposited in a window 20 that is formed in a surrounding layer 22 of silicon nitride. Silicon nitride is a good barrier against the diffusion of Ga, and will prevent any Ga in the epitaxial crystal growth structure 14 from reaching the underlying silicon substrate 12. If some Ga does reach the silicon substrate 12, it will cause degradation and change of characteristics of any existing devices in the silicon as Ga is a acceptor dopant in silicon. Furthermore, layer 22 could contain a silicon dioxide layer on top of the silicon nitride that could help in removing unwanted polycrystalline material 24 which is deposited on layer 22 during a non-selective epitaxial growth. The purpose of this structure is to reduce the tendency of the silicon substrate 12 to warp due to the mismatch in the coefficient of thermal expansion between the silicon substrate 12 and crystalline structure 14. The buffer layer (a) in structure 14 may contain strained-layer superlattices in order to bend any possible dislocations, arising at the interface between the silicon substrate 12 and structure 14, towards the edge of the window 20.

Figure 4:
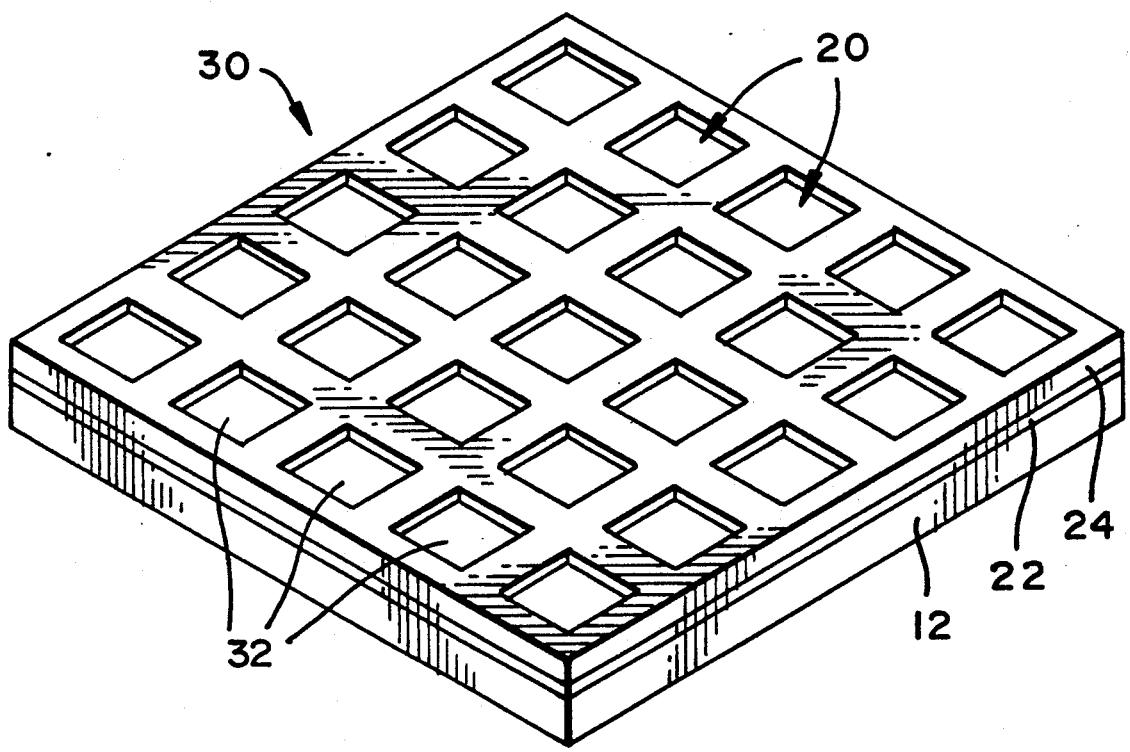

In FIG. 4, an array 30 of optical devices is shown which is constructed in accordance with the structure illustrated in FIG. 3. As illustrated, a plurality of optical devices 32, such as LEDs, are formed by epitaxial growth in a plurality of windows 20 formed in silicon nitride layer 22. The growth outside the windows 20 on layer 22 is polycrystalline. The above can be used as a monochrome display panel on a silicon substrate. With multi-layer GRINSCH structures, as in FIGS. 1B and 2C, multi-color displays can be formed. Through combination of blue-emitting ZnS diodes, and red and green LEDs based on FIGS. 2A, 2B or 2C, a complete color display on silicon can be manufactured. The underlying silicon can be used for fabricating the driving circuits for the optical sources.

The foregoing structures are advantageous for a number of reasons. Silicon wafers having large diameters are currently available at low cost. Silicon is a material with high thermal conductivity, allowing for efficient heat-sinking of the optical devices. Silicon-based technology is by far the most advanced, and can give rise to monolithic integration between silicon-based devices and the devices on the heteroepitaxial crystal, thus utilizing the advantages of both materials. Other applications for these devices include infrared lasers which can be used, for example, to replace large numbers of metallic pads for off-chip communications. On-chip communications could also be speeded up by using lasers and detectors rather than metallic connections.

Although the invention has been disclosed in terms of preferred embodiments, it will be understood that numerous variations and modifications could be made thereto without departing from the true spirit and scope thereof as set forth in the following claims.

What is claimed is:

1. An optical semiconductor structure comprising:
   a) a silicon base layer;
   b) a silicon compound layer formed on said silicon base layer, said silicon compound layer including at least a first window therein;
   c) at least a first epitaxially grown crystalline structure formed on said silicon base layer in said first window, said crystalline structure being formed from a material that is near lattice matched with said silicon base layer; and,
   d) at least a first quantum well layer formed in said first crystalline structure which forms a first active light emitting region for said optical semiconductor structure.

2. The semiconductor structure of claim 1, further including:
   e) at least a second window in said silicon compound layer;
   f) at least a second epitaxially grown crystalline structure formed on said silicon base layer in said second window, said second crystalline structure also being formed from a material that is near lattice matched with said silicon base layer; and
   g) at least a second quantum well layer formed in said second crystalline structure which forms a second active light emitting region for said optical semiconductor structure.

3. The semiconductor structure of claim 1, further including at least a third quantum well layer formed in said first crystalline structure, and at least a fourth quantum well layer formed in said second crystalline structure; and wherein, said first and second quantum well layers emit light of a first wavelength, and said third and fourth quantum well layers emit light of a second wavelength.

4. The semiconductor structure of claim 1, wherein said silicon compound is chosen from the group consisting of silicon dioxide and silicon nitride.

5. An optical semiconductor structure comprising:
   a) a silicon base layer;
   b) an epitaxially grown crystalline structure disposed on said silicon base layer, said crystalline structure being composed of a material which is near lattice matched with said silicon base layer;
   c) a first quantum well layer formed in said crystalline structure forming an active light emitting region for said optical semiconductor structure; and
   d) first and second graded index regions on either side of said first quantum well layer in said crystalline structure which forms a graded index separate confinement heterostructure.

6. The optical semiconductor structure of claim 5 wherein said crystalline structure is formed from a material chosen from the group consisting of GaP, ZnS, or AlGaP.

7. The optical semiconductor structure of claim 5 wherein said quantum well layer is formed from direct bandgap material.

8. The optical semiconductor structure of claim 7 wherein said quantum well layer is lattice mismatched with silicon.

9. The structure of claim 5 wherein said optical semiconductor structure is a laser.

10. The structure of claim 5 wherein said optical semiconductor structure is an LED.

11. An optical semiconductor structure comprising:
    a) a silicon base layer;
    b) an epitaxially grown crystalline structure disposed on said silicon base layer, said crystalline structure being composed of a material that is near lattice matched with said silicon base layer; and,
    c) at least a first quantum well layer formed in said crystalline structure forming an active light emitting region for said optical semiconductor structure, wherein said quantum well layer is formed from a material that is lattice mismatched with said crystalline structure, and has a thickness less than a critical thickness above which dislocations will form between said quantum well layer and said crystalline structure.

12. The optical semiconductor structure of claim 11 wherein said quantum well layer is formed from direct bandgap material.

13. The optical semiconductor structure of claim 12 wherein said crystalline structure is formed from AlGaP, and said quantum well layer is formed from GaAs and is less than approximately 100 angstroms thick.

14. The optical semiconductor structure of claim 11 wherein said quantum well layer is formed from indirect bandgap material with isoelectronic centers to allow radiative recombinations with reasonable efficiency.

* * * * *